United States Patent [19]

Diel et al.

[11] 3,811,187

[45] May 21, 1974

[54] METHOD FOR MASS PRODUCTION OF HOUSINGS FOR SEMICONDUCTOR DEVICES PROVIDED WITH REQUIRED CONNECTING TERMINALS

[75] Inventors: Burkhart Diel; Kurt Gregor; Walther Huber, all of Munich, Germany

[73] Assignee: Siemens Aktiengesellschaft, Berlin and Munich, Germany

[22] Filed: June 22, 1972

[21] Appl. No.: 265,169

Related U.S. Application Data

[62] Division of Ser. No. 67,079, Aug. 26, 1970.

[52] U.S. Cl. .................... 29/630 R, 29/625, 29/626, 174/52 R, 174/DIG. 3

[51] Int. Cl. .................... H01r 9/00

[58] Field of Search ............ 29/625, 626, 627, 630; 174/52, DIG. 3; 65/59

[56] References Cited

UNITED STATES PATENTS

| | | | |
|---|---|---|---|
| 3,560,180 | 2/1971 | Merat | 29/588 |
| 3,262,022 | 7/1966 | Caracciolo | 174/DIG. 3 |
| 3,271,625 | 9/1966 | Caracciolo | 174/DIG. 3 |

*Primary Examiner*—Charles W. Lanham
*Assistant Examiner*—James R. Duzan
*Attorney, Agent, or Firm*—Herbert L. Lerner

[57] ABSTRACT

A sheet of electrical contact metal having a pair of substantially planar surfaces is perforated with perforations forming a pattern of spaced individual tongues extending inwardly toward a central area of the pattern in the plane of the sheet. A housing bottom of sinterable insulating material is positioned on one planar surface of the perforated sheet over the pattern of tongues in the central area of the pattern. A lower housing frame portion of insulating material is positioned on the other planar surface of the perforated sheet directly opposite the housing bottom over the pattern of tongues in the central area of the pattern. The housing bottom and the housing frame portion are sintered to hermetically seal the pattern of tongues between the housing bottom and the housing frame thereby forming a box-like lower housing portion with the free ends of the tongues in the central area of the pattern positioned in mutually insulated relation at the bottom of the housing portion.

10 Claims, 2 Drawing Figures

PATENTED MAY 21 1974 3,811,187

Figure 1:
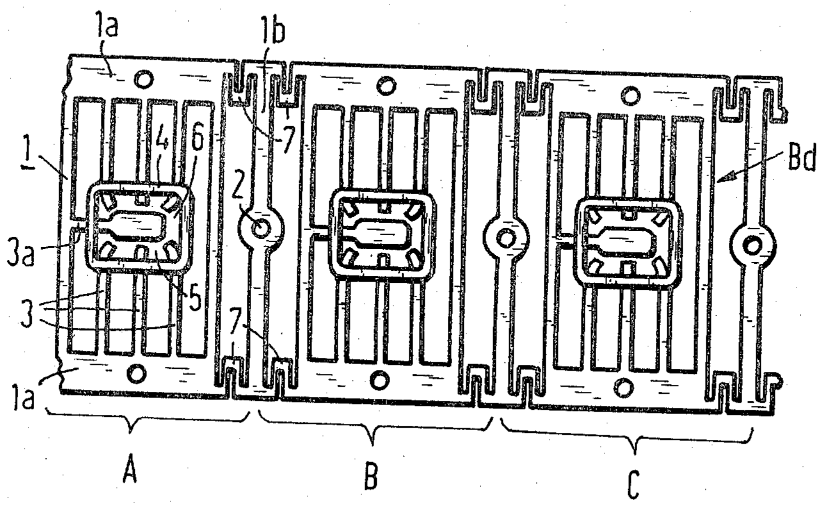

METHOD FOR MASS PRODUCTION OF HOUSINGS FOR SEMICONDUCTOR DEVICES PROVIDED WITH REQUIRED CONNECTING TERMINALS

This is a division, of application Ser. No. 67,079, filed Aug. 26, 1970.

DESCRIPTION OF THE INVENTION

The invention relates to a method of mass production of housings for semiconductor devices. More particularly, the invention relates to a method of mass production of housings for semiconductor devices having required electrical connecting terminals therewithin.

It is known to utilize as the contacting material for contacting electrical components in mass production, a carrier body which is designed as a conveyor belt and which is provided with a raster having incisions. The raster is adjusted to a circuit component to be produced. The number of outer electrodes of the component to be produced results in a specific geometric pattern. A method of this type is described, for example, in Austrian Pat. No 270,752.

During the assembly of semiconductor devices, especially integrated circuits, it is preferable to utilize a housing in which the position of the semiconductor device is definitely located by appropriate mating surfaces. Electrically conductive leads extend in specific locations into the interior of the housing and are tightly connected therewith. The free ends of the electrically conductive leads thus assume, without further operations, the positions required for the electrical connection of the electrodes of the semiconductor device, as soon as the semiconductor device is properly positioned in the housing.

The principal object of the invention is to provide a method for mass production of housings for semiconductor devices having required electrical connecting terminals therewithin.

An object of the invention is to provide a method for mass production of housings for semiconductor devices having required electrical connecting terminals therewith in an economical manner.

An object of the invention is to provide a method for mass production of housings for semiconductor devices having required electrical connecting terminals therewithin, which method is simple, efficient, effective and reliable, as well as economical.

In accordance with the present invention, a method of mass production of housings for semiconductor devices having required electrical connecting terminals therewithin, the housings having a useful space adjusted to the size and shape of a semiconductor device to be accommodated for housing such semiconductor device in a manner whereby the electrodes of the semiconductor device are held in electrical contact with corresponding connecting terminals of the housing, comprises the steps of perforating a sheet of electrical contact metal having a pair of substantially planar surfaces with perforations forming a pattern of spaced individual tongues extending inwardly toward a central area of the pattern in the plane of the sheet, positioning a housing bottom of sinterable insulating material on one planar surface of the perforated sheet over the pattern of tongues in the central area of the pattern, positioning a lower housing frame portion of insulating material on the other planar surface of the perforated sheet directly opposite the housing bottom over the pattern of tongues in the central area of the pattern, and sintering the housing bottom and the housing frame portion to hermetically seal the pattern of tongues between the housing bottom and the housing frame thereby forming a box-like lower housing portion with the free ends of the tongues in the central area of the pattern positioned in mutually insulated relation at the bottom of said housing portion.

The sheet is perforated to form adjacent congruent sections each having a frame and a plurality of spaced individual tongues extending inwardly from the frame toward a central area in the plane of the sheet and the lower housing portion is of open box-like configuration. The sheet comprises Kovar or gold-plated Kovar.

The sheet is formed with buffer portions between adjacent section for absorbing thermal stresses.

In accordance with the invention, a sintering mold for joining a plurality of housing bottoms and a plurality of corresponding housing frame portions thereto to hermetically seal a pattern of tongues between each housing bottom and each corresponding housing frame, comprises a plate-shaped lower portion having a plurality of spaced recessed pits formed therein each adapted to house a housing bottom, and a plate-shaped upper portion having shaft-like recesses formed therethrough each recess being provided over a corresponding one of the recessed pits of the lower portion and being adapted to admit a housing frame portion. The lower and upper portions are positioned in juxtaposed relation with the pits of the lower portion and the corresponding recesses of the upper portion in coaxial relation. Each of the lower and upper portions comprises graphite.

In accordance with the invention, a method of sintering a plurality of housing bottoms and a plurality of corresponding housing frame portions thereto to hermetically seal a pattern of tongues formed in a perforated sheet between each housing bottom and each corresponding housing frame in a mold comprising a plate-shaped lower portion having a plurality of spaced recessed pits formed therein each adapted to house a housing bottom and a plate-shaped upper portion having shaft-like recesses formed therethrough each recess being provided over a corresponding one of the recessed pits of the lower portion and being adapted to admit a housing frame portion, the lower and upper portions being positioned in juxtaposed relation with the pits of the lower portion and the corresponding recesses of the upper portion in coaxial relation, comprises inserting a housing bottom in each of the pits of the lower portion, positioning the perforated sheet on the lower portion with a pattern of tongues thereof on each housing bottom, positioning the upper portion on the lower portion and guiding the lower and upper portions so that each recess of the upper portion is coaxially positioned over a corresponding one of the pits of the lower portion, inserting a housing frame portion through each recess of the upper portion onto the pattern of tongues on the corresponding housing bottom, loading each housing frame portion with a graphite weight on it in the corresponding recess of the upper portion, and heating in a sinter furnace to sintering temperature. Heating is to approximately 1,000° C.

The upper portion of the sintering mold holds the semiconductor devices in their desired positions, so that the proper electrical contacts may be made.

Each semiconductor device is of substantially planar structure. In such structure, all the electrodes are located at the same surface of the semiconductor wafer or plate. It is thus logical to provide all the electrical connecting terminals via the pattern of tongues of the sheet of electrical contact metal. When a semiconductor device is then positioned in the useful space of the box-shaped housing bottom produced by the method of the invention, with the electrode surface facing downward, the result, at suitable or appropriate dimensioning and arrangement of the tongues, is that each electrode extends in a specific electrical connection, at the corresponding lead, in the configuration of a corresponding one of the tongues and such configuration is retained after the housing is hermetically sealed.

The insulating layer such as, for example, $SiO_2$ or $Si_3N_4$, which is often utilized in a planar device and in other semiconductor devices, is provided at the surface of the semiconductor device which is not occupied by the electrodes. This eliminates the need for additional insulation at the semiconductor surface, prior to the installation of the semiconductor device into the housing.

The buffer portions between adjacent sections are in zig zag or meander shaped configuration and function as connecting points between adjacent sections of the perforated sheet. The buffer portions absorb thermal stresses or stresses caused by thermal expansion which occur during the sintering of the housing components in a sintering mold. This eliminates disturbances during the production of the housings.

In order to provide substantially planar housings, in accordance with the method of the invention, glass or glazed ceramic housing bottoms are utilized. The housing bottoms, the perforated metal sheet and the housing frame portions of sintered glass, for example, are positioned in the graphite sintering mold, in specific positions relative to each other and are joined together by heating to sintering temperatures. The shape and size of the recessed pits formed in the lower portion of the sintering mold are adjusted to the shape and size of the housing bottoms. The recessed pits are provided at a depth which permits the installed housing bottoms to project to slightly therefrom by, for example, less than one-tenth of a millimeter.

The cross-sectional area of each of the shaft-like recesses formed through the upper portion of the sintering mold corresponds to the cross-sectional area of the housing frame portions which are inserted therein. The lower components are inserted as soon as, with the assistance of the intermediately positioned perforated sheet, the upper portion of the sintering mold is mounted in the desired position on the lower portion of the sintering mold and the housing bottoms are positioned in such lower portion. In this manner, the housing frame portions inserted in the shaft-like recesses of the upper portion of the sintering mold are immediately positioned suitably for the sintering process, relatively to the housing bottoms and the intermediately positioned patterns of tongues of the perforated sheet.

The perforated sheet is held between the upper and lower portions of the sintering mold in its position suitable for the sintering process. The position of the perforated sheet is determined with the assistance of holding pins in their proper portions for the sintering process, and at a suitable pressure, the housing bottom and the lower housing frame portion are brought into contact and hermetically joined by the sintering process. Suitable pressure is applied to the components by graphite weights which are inserted into the shaft-like recesses formed through the upper portion of the sintering mold. The graphite weights are loaded onto the housing frames to provide suitable pressure for the sintering process. The graphite weights preferably have a configuration at their surfaces which face the perforated sheet which is such that the desired configuration of the resultant recess is impressed in the lower housing frame portion during the sintering process. Each of the shaft-like recesses and each of the graphite weights must also be shaped in a manner whereby the softened housing bottoms cannot be penetrated due to the pressure exerted by the graphite weights. At the same time, the weights prevent the sinterable material of the housing frame portions and of the housing bottoms from smearing the contact area of the pattern of tongues of the perforated metal sheet.

Figure 2:
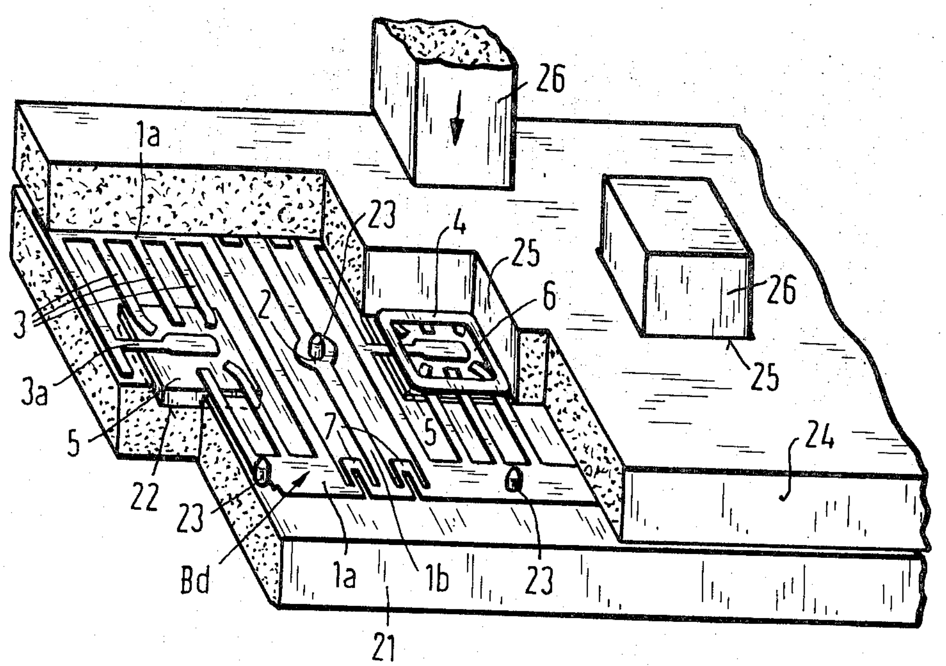

In order that the invention may be readily carried into effect, it will now be described with reference to the accompanying drawing, wherein:

FIG. 1 is a top view of an embodiment of housings for semiconductor devices produced by the method of the invention; and FIG. 2 is a perspective cutaway view of an embodiment of the sintering mold of the invention as utilized during the performance of the method of the invention.

In the FIGS., the same components are identified by the same reference numerals.

The metal sheet Bd, as shown in FIG. 1, is produced by being perforated or punched out of suitable contacting metal such as, for example, gold plated Kovar. The perforated sheet Bd comprises a plurality of individual sections A, B and C, adjacent each other. All the sections A, B and C of the perforated sheet Bd are substantially coplanar.

In order to provide mechanical stability for the individual sections A, B and C of the perforated metal sheet Bd, each frame such as, for example, the frame 1, comprises a plurality of longitudinally extending members or struts 1a and a transverse member or cross-beam 1*b* interposed between adjacent ones of the sections A, B and C. Each of the cross-beams 1*b* has a central aperture 2 formed therethrough for accommodating a holding pin.

A pattern of spaced individual tongues 3 is formed in each section A, B and C. The tongues 3 of each pattern extend inwardly from the longitudinally extending frames 1*a* toward a central area of the pattern in the plane of the sheet. Each pattern of tongues 3 is completely enclosed by its corresponding frame 1. The tongues 3 of each pattern of tongues function as electrically conducting connecting leads for the housing being produced. At least one of the tongues 3*a* may be formed in a special configuration and may function, for example, as a carrier electrode for the housing to be produced.

FIG. 1 illustrates how a lower housing frame portion 4 is joined by sintering to the perforated metal sheet Bd in each of the individual sections A, B and C. Each lower housing frame portion 4 is joined to a corresponding housing bottom 5, by a sintering process.

Each housing bottom 5 is positioned below the corresponding lower housing frame portion 4. Each housing bottom 5 and the corresponding lower housing frame portion 4 forms a box-shaped lower housing portion.

Each of the lower housing portions has a recess 6 formed therein which provides a useful space for accommodating a semiconductor device. The electrode geometry and other geometries of each semiconductor device are adjusted to the geometry of the useful space 6 formed in each box-like lower housing portion. That is, the dimensions of each semiconductor device correspond to the dimensions of each useful space 6.

The individual sections A, B and C of the perforated metal sheet Bd are joined to each other by buffer portions 7. The buffer portions are of zig zag or meander configuration and function to absorb thermal stresses, as hereinafter described.

The tongues 3 and 3a are perforated or cut out in th desired pattern and the lower housing portions are separated from the perforated sheet Bd, so that so many of the tongues remain outside the lower housing portions that additional electrical contact may be provided without difficulty. Semiconductor devices, having electrodes, are positioned in the recesses 6 of the lower housing portions.

The semiconductor devices, in the illustrated example, are of rectangular configuration, and constitute the components of an integrated circuit. Each housing is covered by a cover of sinterable material and is hermetically sealed in a reduced atmosphere. The hermetic sealing is accomplished by a sintering process. The sintering process may be performed before the perforated metal sheet Bd is separated into its individual sections.

FIG. 2 illustrates a sintering mold which may be utilized for the production of the semiconductor devices in accordance with the method of the invention. The sintering mold comprises a plate-shaped lower portion 21 of graphite. A plurality of spaced recessed pits or recesses 22 are formed in the upper surface of the lower portion 21. Each of the pits 22 formed in the lower portion 21 is adapted to accommodate a housing bottom 5 (FIGS. 1 and 2). The dimensions of each of the pits 22 thus correspond to the dimensions of each of th housing bottoms 5.

A housing bottom 5 is positioned in each of the pits 22 formed in the lower portion 21. The perforated metal sheet Bd is then placed on the upper surface of the lower portion 21 so that it covers the housing bottoms 5. The perforated metal sheet Bd is held in position by a plurality of holding pins 23 so that the pattern of tongues 3, 3*a* of each section is suitably positioned above each housing bottom 5.

A plate-shaped upper portion 24 of the sintering mold, which also comprises graphite, is then positioned on the perforated metal sheet B*d*. The upper portion 24 of the sintering mold has a plurality of shaft-like recesses 25 formed therethrough. The upper portion 24 is placed on the perforated sheet B*d* in a manner whereby each of the recesses 25 is provided over a corresponding one of the recessed pits 22 formed in the lower portion 21. The dimensions of each of the shaft-like recesses 25 correspond to the dimensions of each housing frame portion 4, so that each housing frame portion may be accommodated in a corresponding one of said recesses, as shown in FIG. 2.

After the lower and upper portions 21 and 24 of the sintering mold are positioned in juxtaposed relation with the pits 22 of said lower portion and the corresponding recesses 25 of said upper portion in coaxial relation, a housing frame portion 4 is inserted in each of said recesses. The housing frame portions are moved downward through the corresponding recesses 25 until they are pressed against the corresponding tongue pattern of the perforated sheet Ed and the corresponding housing bottom 5 positioned under such tongue pattern.

Each of the housing frame portions 4 is pressed against the corresponding tongue pattern by a holding graphite weight 26, as shown in FIG. 2. Each of the graphite weights 26 exerts pressure on the housing frame portion 4 on which it is placed and presses such housing frame portion to the corresponding tongue pattern.

All the components, positioned in the aforedescribed manner, as shown in FIG. 2, are then heated in a furnace to sintering temperature such as, for example, approximately 1,000° C. The housing bottoms 5, which may comprise glass, and the housing frame portions 4, which may comprise glass, are thus softened, so that the pressure exerted by the loading weights 26 produces a permanent hermetic, and particularly vacuum tight, seal between said housing bottoms and said housing frame portions, with the pattern of tongues 3, 3*a* therebetween.

The perforated sheet Bd also expands in the sintering mold, when sintering temperatures are provided. This is due to the greater thermal expansion of the metal relative to the graphite of the lower and upper portions 21 and 24 of the sintering mold. It is therefore desirable to eliminate the aforedescribed thermal expansion, in order to reduce to a minimum variations between the sections A, B and C of the perforated sheet Bd with regard to the pits 22 formed in the lower portion 21 sintering form and the recesses 25 formed in the upper portion 24 of said sintering mold.

Variable expansion of the perforated sheet Bd relative to the sintering mold is reduced to a minimum by providing the buffer portions 7 between adjacent ones of the sections A, B and C (FIG. 1). Each of the buffer portions 7 is of zig zag or meander configuration and supports a corresponding one of the cross-beams 1b. The buffer sections 7 maintain the sections A, B and C of the perforated sheet B*d* in their proper positions in the sintering mold, during the sintering process. The buffer portions 7 are so dimensioned that they have sufficient mechanical stability for additional processing. Furthermore, the buffer portions 7 elastically absorb the stresses which are produced during the heating process.

While the invention has been described by means of a specific example and in a specific embodiment, we do not wish to be limited thereto, for obvious modifications will occur to those skilled in the art without departing from the spirit and scope of the invention.

We claim:

1. A method of manufacture of a housing having a housing bottom and a housing frame portion of sinterable material in a sintering mold comprising a lower portion of heat resistant and heat conducting material having a recessed pit formed therein adapted to accommodate the housing bottom and an upper portion having a shaft-like recess formed therethrough, the housing accommodating a semiconductor device in a useful space formed by the housing and geometrically adapted in configuration to the semiconductor device, the housing including a pattern of electrically conductive tongues formed from a single piece of perforated sheet metal and extending inwarding from an integral frame toward the center between the housing bottom and the housing frame and passing laterally through the side wall of the housing bottom in insulated relation therewith, the semiconductor device being maintained by the housing frame in contact position with the free ends of the tongues, said method comprising the steps of clamping the tongues away from the frame and away from their free ends between the housing bottom and the frame to form a trough-shaped lower part of the housing;

inserting the housing bottom into the pit of the lower portion of the sintering mold;

positioning the tongues on the housing bottom;

positioning the upper portion of the sintering mold on the lower portion of the sintering mold so that the recess of the upper portion of the sintering mold is over the pit of the lower portion of the sintering mold;

positioning the housing frame in the recess formed through the upper portion of the sintering mold at a location for sintering to the tongues;

loading the housing bottom, tongues and housing frame portion;

sintering the housing bottom, tongues and housing frame portion under load by heating;

removing the trough-shaped part of the housing from the sintering mold; and removing electrical connections between the tongues still present via the frame.

2. A method of sintering a plurality of housing bottoms and a plurality of corresponding housing frame portions thereto to hermetically seal a pattern of tongues formed in a perforated sheet between each housing bottom and each corresponding housing frame in a mold comprising a plate-shaped lower portion having a plurality of spaced recessed pits formed therein each adapted to house a housing bottom and a plate-shaped upper portion having shaft-like recesses formed therethrough each recess being provided over a corresponding one of the recessed pits of the lower portion and being adapted to admit a housing frame portion, said lower and upper portions being positioned in juxtaposed relation with the pits of the lower portion and the corresponding recesses of the upper portion in coaxial relation, said method comprising the steps of inserting a housing bottom in each of the pits of the lower portion;

positioning the perforated sheet on the lower portion with a pattern of tongues thereof on each housing bottom;

positioning the upper portion on thee lower portion and guiding the lower and upper portions so that each recess of the upper portion is coaxially positioned over a corresponding one of the pits of the lower portion;

inserting a housing frame portion through each recess of the upper portion onto the pattern of tongues on the corresponding housing bottom;

loading each housing frame portion with a graphite weight on it in the corresponding recess of the upper portion; and heating in a sinter furnace to sintering temperature.

3. A method as claimed in claim 2, wherein heating is to approximately 1,000° C.

4. A method as claimed in claim 1, wherein the lower portion of the sintering mold has an upper surface and the pit if formed in the upper surface and the housing bottom is inserted into the pit; the tongues interconnected by the frame are placed on the housing bottom, the upper portion of the sintering mold is placed on the lower portion of the sintering mold and the tongues with the recess therethrough directly above the pit, the housing frame portion is inserted into the recess formed through the upper portion of the sintering mold and is thereby guided directly into the correct position, the housing frame portion is loaded with a weight, and the housing bottom, tongues and housing frame portion are heated until sintered.

5. A method as claimed in claim 1, wherein a plurality of mechanically connected frames and tongues extending therefrom are formed from a single piece of sheet metal and are sintered with a plurality of housing bottoms and housing frame portions, the tongues of each frame being sintered with a corresponding one of the housing bottoms and a corresponding one of the housing frame portions in a single sintering mold, each forming a trough-shaped lower part of a corresponding housing, and the mechanical connections between the frames are severed after the trough-shaped lower parts of the housings are formed.

6. A method as claimed in claim 1, wherein the upper portion and lower portion of the sintering mold are removable secured in position during the sintering process by guide pins.

7. A method as claimed in claim 1, wherein the frame and the tongues extending therefrom are removably secured in position in the upper portion and lower portion of the sintering mold by guide pins.

8. A method as claimed in claim 7, wherein the frames and tongues extending therefrom are formed of a single strip of sheet metal in a plurality of tandem-connected sections, and a plurality of the sections are simultaneously sintered with the corresponding ones of the housing bottoms and housing frame portions, in side by side relation, in a single sintering mold accommodating the housing bottoms, housing frame portions and frames and tongues.

9. A method as claimed in claim 8, wherein the frames are buffered by connecting a buffer element between each pair of adjacent frames for absorbing thermal stresses and deformations.

10. A method as claimed in claim 9, in which each of the buffer elements comprises a flexible strip of sheet metal in a common plane with the frames and including at least one bend and each of the frames includes a member having an aperture which receives one of the guide pins.

* * * * *